United States Patent
Chan et al.

(10) Patent No.: US 7,132,352 B1
(45) Date of Patent: Nov. 7, 2006

(54) METHOD OF ELIMINATING SOURCE/DRAIN JUNCTION SPIKING, AND DEVICE PRODUCED THEREBY

(75) Inventors: Simon Siu-Sing Chan, Saratoga, CA (US); Paul R. Besser, Sunnyvale, CA (US); Jeffrey P. Patton, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/913,184

(22) Filed: Aug. 6, 2004

(51) Int. Cl.
*H01L 21/28* (2006.01)
(52) U.S. Cl. ............... 438/581; 438/630; 257/E23.157; 257/21.006
(58) Field of Classification Search ................ 438/682, 438/581, 630; 257/E23.157, E21.006
See application file for complete search history.

(56) References Cited

U.S. PATENT DOCUMENTS

| | | | | |
|---|---|---|---|---|
| 4,446,194 A | * | 5/1984 | Candelaria et al. ......... 428/428 |
| 4,933,742 A | * | 6/1990 | Brown et al. ............... 257/753 |
| 4,978,420 A | * | 12/1990 | Bach ........................... 438/624 |
| 4,988,423 A | * | 1/1991 | Yamamoto et al. .... 204/192.17 |
| 5,046,043 A | * | 9/1991 | Miller et al. ................ 365/145 |
| 5,448,097 A | * | 9/1995 | Mizushima et al. ........ 257/435 |
| 6,265,271 B1 | * | 7/2001 | Thei et al. .................. 438/296 |
| 6,455,420 B1 | * | 9/2002 | Suenaga ..................... 438/655 |

OTHER PUBLICATIONS

Powell, R.L. and Childs, G.E., American Institute of Physics Handbook, 3rd Edition, Gray, D.E., Ed., McGraw Hill, NY, 1972 pp. 12-196-12-197.*

* cited by examiner

*Primary Examiner*—Michelle Estrada
*Assistant Examiner*—Nicholas J Tobergte
(74) *Attorney, Agent, or Firm*—Mikio Ishimaru

(57) ABSTRACT

A method of forming an integrated circuit with a semiconductor substrate is provided. A gate dielectric is formed on the semiconductor substrate, and a gate is formed on the gate dielectric. A metallic layer is formed on the semiconductor substrate, and the metallic layer is reacted with the semiconductor substrate to form an early phase of silicide. Implanted shallow source/drain junctions are formed immediately beneath the silicide. A final phase of the silicide is formed. An interlayer dielectric is deposited above the semiconductor substrate, and contacts are then formed to the silicide.

10 Claims, 4 Drawing Sheets

METHOD OF ELIMINATING SOURCE/DRAIN JUNCTION SPIKING, AND DEVICE PRODUCED THEREBY

BACKGROUND

1. Technical Field

The present invention relates generally to semiconductor technology, and more specifically to siliciding and shallow junction formation in semiconductor devices.

2. Background Art

At the present time, electronic products are used in almost every aspect of life, and the heart of these electronic products is the integrated circuit. Integrated circuits are used in everything from airplanes and televisions to wristwatches.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each wafer worth hundreds or thousands of dollars.

Integrated circuits are made up of hundreds to millions of individual components. One common component is the semiconductor transistor. The most common and important semiconductor technology presently used is silicon-based, and the most preferred silicon-based semiconductor device is a Complementary Metal Oxide Semiconductor ("CMOS") transistor.

The principal elements of a CMOS transistor generally consist of a silicon substrate having shallow trench oxide isolation regions cordoning off transistor areas. The transistor areas contain polysilicon gates on silicon oxide gates, or gate oxides, over the silicon substrate. The silicon substrate on both sides of the polysilicon gate is slightly doped by ion implantation of boron or phosphorus impurity atoms into the surface of the silicon substrate, thereby becoming conductive. These lightly doped regions of the silicon substrate are referred to as "shallow source/drain junctions", which are separated by a channel region beneath the polysilicon gate.

A curved silicon oxide or silicon nitride spacer, referred to as a "sidewall spacer", on the sides of the polysilicon gate allows deposition of additional doping to form more heavily doped regions of the shallow source/drain ("S/D") junctions, which are called "deep S/D junctions". The shallow and deep S/D junctions together are collectively referred to as "S/D junctions".

To complete the transistor, a silicon oxide dielectric layer is deposited to cover the polysilicon gate, the curved spacer, and the silicon substrate. To provide electrical connections for the transistor, openings are etched in the silicon oxide dielectric layer to the polysilicon gate and the S/D junctions. The openings are filled with metal to form electrical contacts. To complete the integrated circuits, the contacts are connected to additional levels of wiring in additional levels of dielectric material to the outside of the dielectric material.

In operation, an input signal to the gate contact to the polysilicon gate controls the flow of electric current from one S/D contact through one S/D junction through the channel to the other S/D junction and to the other S/D contact.

As transistors have decreased in size, it has been found that the electrical resistance between the metal contacts and the silicon substrate or the polysilicon has increased to the level where it degrades the performance of the transistors. To lower the electrical resistance, a transition material is formed between the metal contacts and the silicon substrate or the polysilicon. The best transition materials have been found to be cobalt silicide ($CoSi_2$), nickel silicide ($NiSi_2$), platinum silicide (PtSi), and titanium silicide ($TiSi_2$).

The silicides are formed by first applying a thin layer of the transition material (e.g., cobalt, nickel, platinum, or titanium) on the silicon substrate above the S/D junctions and the polysilicon gates. The semiconductor wafer is subjected to one or more annealing steps at temperatures above 700° C. and this causes the transition material to selectively react with the silicon and the polysilicon to form the metal silicide. The process is generally referred to as "siliciding". Since the shallow trench oxide and the sidewall spacers will not react to form an early phase of silicide, the silicides are aligned over the S/D junctions and the polysilicon gates so the process is also referred to as "self-aligned siliciding", or "saliciding".

Salicidation technology is vital for improving the operating speed of modern semiconductor devices with submicron feature sizes. The salicide technology is widely use to increase the packing density of integrated circuits and to reduce the circuit interconnect resistance for high-speed operation. With the continuous decrease in device sizes (transistors becoming narrower and thinner and transistor channels becoming shorter), product yields and reliability continue to suffer from salicidation problems like junction punchthrough, current leakage, and elevated contact resistance.

In general, salicidation of shallow S/D junctions can lead to high junction leakage due to silicide penetration through the junction into the silicon substrate beneath. The silicide forms "spikes" that punch through the junction to cause the current leakage.

Residual metal from the salicidation process can also cause leakage. The silicide across the sidewall spacers may not be totally removed after the salicidation. The residual metal can cause a bridge between adjacent circuit features, like the gate and the S/D regions, causing current leakage.

Nevertheless, as device dimensions continue to be scaled to smaller and smaller dimensions, it is necessary to scale down extension junction depths as well. Furthermore, shallow junctions are increasingly needed to control adverse charge-sharing effects (two dimensional short channel effects) in advanced devices such as metal oxide field effect transistors. Extended ultra-shallow S/D junctions can improve such negative effects, can suppress the short channel effect, and can improve device operating speeds.

However, existing shallow S/D junction fabrication technologies, such as ion implantation followed by rapid thermal annealing, have not succeeded in solving all the problems related to fabricating increasingly shallow S/D junctions.

Solutions to these problems have been long sought but prior developments have not taught or suggested any solutions and, thus, solutions to these problems have long eluded those skilled in the art.

DISCLOSURE OF THE INVENTION

The present invention provides a method of forming an integrated circuit. A gate dielectric is formed on a semiconductor substrate, and a gate is formed on the gate dielectric. A silicide metallic layer is formed on the semiconductor substrate, and the silicide metallic layer is reacted with the semiconductor substrate to form an early phase of silicide. Implanted shallow source/drain junctions are formed immediately beneath the silicide. A final phase of the silicide is formed. An interlayer dielectric is deposited above the semiconductor substrate, and contacts are then formed to the silicide. This method significantly lowers junction leakage due to silicide spiking.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
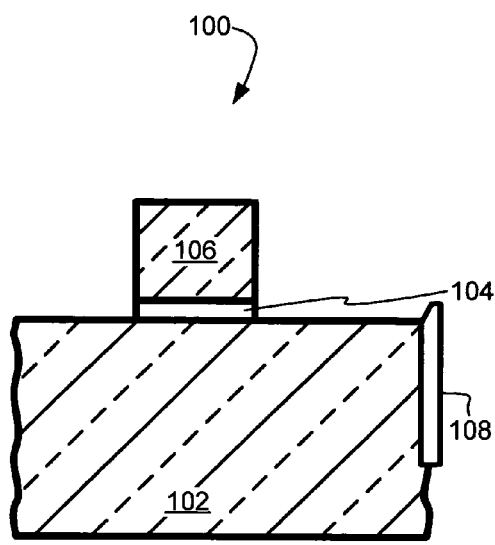
FIG. 1 is a view of a semiconductor integrated circuit in an intermediate stage of fabrication in accordance with the present invention.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. In addition, the drawings showing embodiments of the apparatus are semi-diagrammatic and not to scale and, particularly, some of the dimensions are for the clarity of presentation and may be exaggerated in the drawing FIGs. The same numbers will be used in all the drawing FIGs. to relate to the same elements.

The term "horizontal" as used herein is defined as a plane parallel to a substrate or wafer. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Referring now to FIG. 1, therein is shown a semiconductor integrated circuit, and in particular a transistor 100, in an intermediate stage of fabrication in accordance with the present invention.

To form the intermediate stage, a gate dielectric layer, such as silicon oxide, and a conductive gate layer, such as polysilicon, have been deposited on a semiconductor substrate 102 of a material such as silicon ("Si"). The layers are patterned and etched to form a gate dielectric 104 and a gate 106. The semiconductor substrate 102 has been further patterned, etched, and filled with a silicon oxide material to form a shallow trench isolation ("STF") 108.

Figure 2:
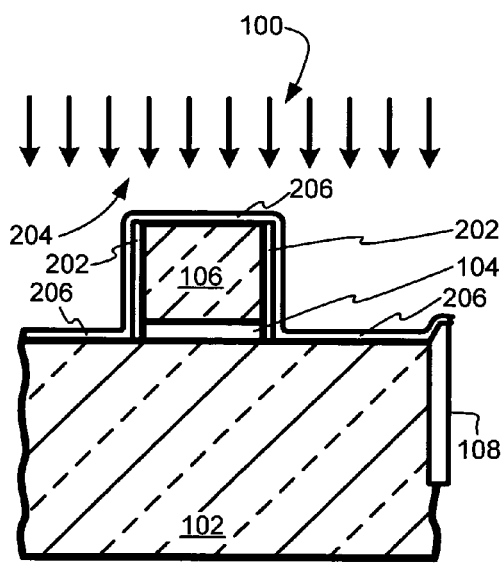
FIG. 2 is the structure of FIG. 1 having an insulating layer and a silicide metallic layer formed thereon.

Referring now to FIG. 2, therein is shown the structure of FIG. 1 having an insulating layer 202 formed on the sides of the gate 106. The insulating layer 202 is formed by depositing an insulating film over the structure of FIG. 1 and anisotropically etching the horizontal surfaces. A deposition process 204 is then used to form a metallic layer 206 in accordance with the present invention. The metallic layer 206, for example of cobalt, nickel, platinum, or titanium, is formed on the surface of the semiconductor substrate 102, the insulating layer 202, and the gate 106. Advantageously, the portion of the metallic layer 206 on the semiconductor substrate 102 can be formed adjacent the gate 106.

Figure 3:
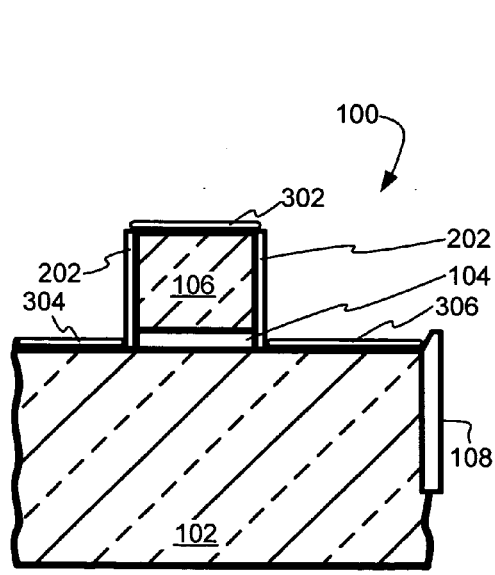
FIG. 3 is the structure of FIG. 2 with an early phase of silicide formed thereon.

Referring now to FIG. 3, therein is shown the structure of FIG. 2 following a heating step that forms an early phase of silicide by reacting the deposited metallic layer 206 (FIG. 2) with the semiconductor substrate 102 and the gate 106. The reaction forms a self-aligned silicide or salicide layer 302 on the gate 106, and forms salicide layers 304 and 306 on the semiconductor substrate 102 on respective sides of the gate 106.

The early phase of silicide is a phase formed in a material such as cobalt silicide at a low temperature from 400° C. to 550° C. After formation of the early phase, a wet chemical strip of the remaining unreacted metallic layer 206 on the non-silicon surfaces is performed to minimize the probability of silicide bridging between salicided gates and source/drain regions.

Figure 4:
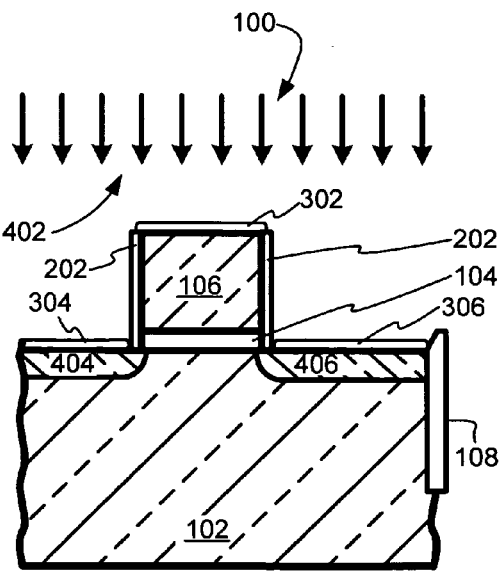
FIG. 4 is the structure of FIG. 3 following formation of shallow source/drain junctions.

Referring now to FIG. 4, therein is shown the structure of FIG. 3 during an ion implantation 402 to form shallow source/drain ("S/D") junctions 404 and 406 immediately beneath the salicide layers 304 and 306. (For clarity and ease of illustration in this and like FIGs., the shallow S/D junctions 404 and 406 are shown greatly exaggerated and with smooth contours.)

The gate 106, the gate dielectric 104, and the insulating layer 202 act as masks for the formation of the shallow S/D junctions 404 and 406 by the ion implantation 402 of boron ("B") or phosphorus ("P") impurity atoms into the surface of the semiconductor substrate 102. The ion implantation 402 is followed by a high-temperature conversion rapid thermal anneal ("RTA") above 700° C. The high-temperature conversion RTA activates the implanted impurity atoms to form the shallow S/D junctions 404 and 406, and forms the final silicide phase of the salicide layers 304 and 306. The final phase of the silicide is a phase formed in a material such as cobalt silicide at a high temperature from 600° C. to 1000° C.

Figure 5:
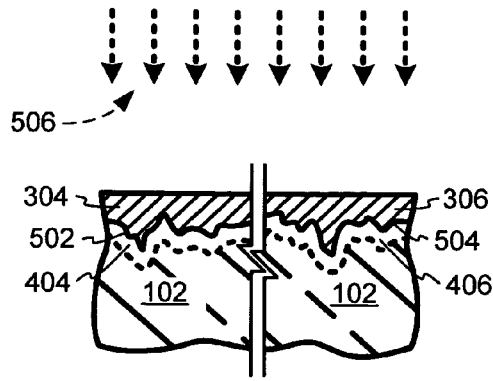
FIG. 5 is an enlarged fragmentary view of portions of the salicide layers and shallow source/drain junctions.

Referring now to FIG. 5, therein is shown an enlarged fragmentary view of respective portions of the salicide layers 304 and 306, the shallow S/D junctions 404 and 406, and the semiconductor substrate 102 immediately thereberneath. The S/D dopant the ion implantation 402 (FIG. 4) has a very low solubility in silicide. Thus, the dopant out diffuses into the semiconductor substrate 102 and pushes ahead of the silicide lower interfaces 502 and 504 during the high-temperature conversion RTA described with respect to FIG. 4. As a result, the shallow S/D junctions 404 and 406 are always ahead of the salicide layers 304 and 306, regardless of the irregularity of the salicide contours.

In the present invention, it has been discovered that any spikes in the salicide layers drive the dopant ahead of the spikes so as to maintain continuous shallow S/D junctions, thereby significantly reducing junction leakage.

If a particular process implementation results in a conversion RTA temperature that is insufficient to satisfactorily activate the implanted dopants, an optional pre-amorphization implant 506 may be used. The optional pre-amorphization implant 506 is performed before the high-temperature conversion RTA in order to lower the dopant activation temperature. The optional pre-amorphization implant 506 may be, for example, an ion implantation of an inert species such as germanium ("Ge"), silicon ("Si"), or Argon ("A")]

Figure 6:
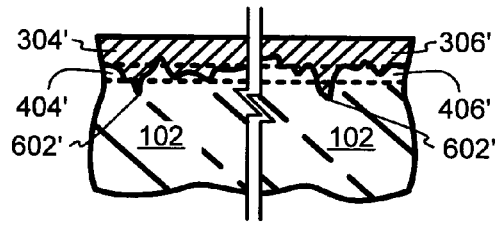
FIG. 6 (PRIOR ART) is a view similar to FIG. 5 of prior art salicide layers and shallow source/drain junctions.

Referring now to FIG. 6 (PRIOR ART), therein is shown an enlarged fragmentary view of respective portions of prior art salicide layers 304' and 306' and shallow S/D junctions 404' and 406' similar to the salicide layers 304 (FIG. 5) and 306 (FIG. 5) and shallow S/D junctions 404 (FIG. 5) and 406 (FIG. 5). In this case, silicidation of the S/D junctions 404' and 406', forming the salicide layers 304' and 306', was performed after the S/D junctions 404' and 406' were formed. The resulting irregular contours of the salicide layers 304' and 306' resulted in spikes 602' that penetrated through the S/D junctions 404' and 406', resulting in significant junction leakage.

Figure 7:
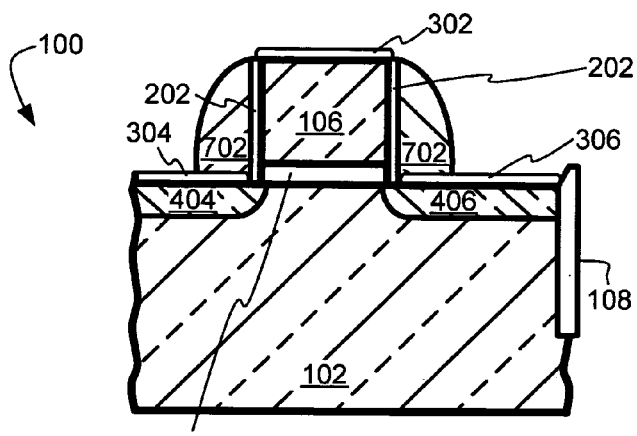
FIG. 7 is the structure of FIG. 4 after formation of a sidewall spacer.

Referring now to FIG. 7, therein is shown the structure of FIG. 3 after formation of a sidewall spacer 702. The sidewall spacer 702, generally of silicon nitride, is a deposited layer that is etched in conventional manner to form a conventional curved shape as shown.

Figure 8:
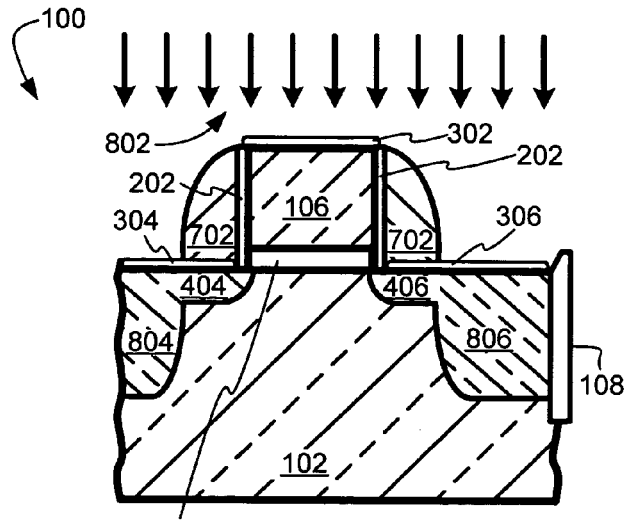
FIG. 8 is the structure of FIG. 7 during ion implantation to form deep source/drain junctions.

Referring now to FIG. 8, therein is shown the structure of FIG. 7 during an ion implantation 802 to form deep S/D junctions 804 and 806. The sidewall spacer 702, the gate 106, and the STI 108 act as masks for the formation of the deep S/D junctions 804 and 806 by the ion implantation 802 of boron or phosphorus impurity atoms into the surface of the semiconductor substrate 102 and into and through the shallow S/D junctions 404 and 406, respectively. The ion implantation 802 is followed by a high-temperature anneal above 700° C. to activate the implanted impurity atoms to form the deep S/D junctions 804 and 806.

Figure 9:
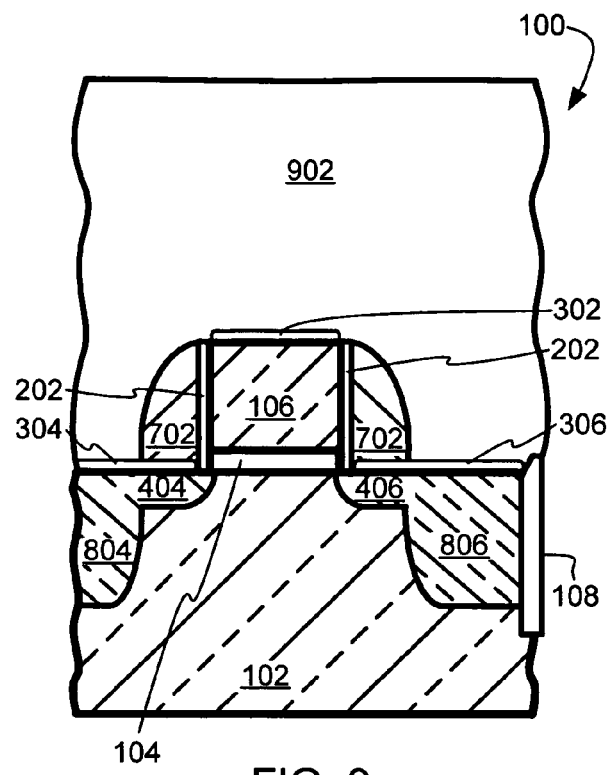
FIG. 9 is the structure of FIG. 8 after deposition of a dielectric layer over the silicide, the sidewall spacer, and the shallow trench isolation.

Referring now to FIG. 9, therein is shown the structure of FIG. 8 after deposition of a dielectric layer 902 over the salicide layers 302, 304, and 306, the sidewall spacer 702, and the STI 108.

In various embodiments, the dielectric layer 902 is of dielectric materials such as silicon oxide ("SiO$_x$"), tetraethylorthosilicate ("TEOS"), borophosphosilicate ("BPSG") glass, etc., with medium dielectric constants from 4.2 to 3.9, or low dielectric constant dielectric materials such as fluorinated tetraethylorthosilicate ("FTEOS"), hydrogen silsesquioxane ("HSQ"), bis-benzocyclobutene ("BCB"), tetramethylorthosilicate ("TMOS"), octamethyleyclotetrasiloxane ("OMCTS"), hexamethyldisiloxane ("HMDS"), trimethylsilil borxle ("SOB"), diaceloxyditerliarybutosiloxane ("DADBS"), trimethylsilil phosphate ("SOP"), etc., with dielectric constants below 3.9 to 2.5. Available ultra-low dielectric constant dielectric materials, having dielectric constants below 2.5, include commercially available Teflon-AF, Teflon microemulsion, polimide nanofoams, silica aerogels, silica xerogels, and mesoporous silica. Stop layers and capping layers (where used) are of materials such as silicon nitride ("Si$_x$N$_x$") or silicon oxynitride ("SiON").

Figure 10:
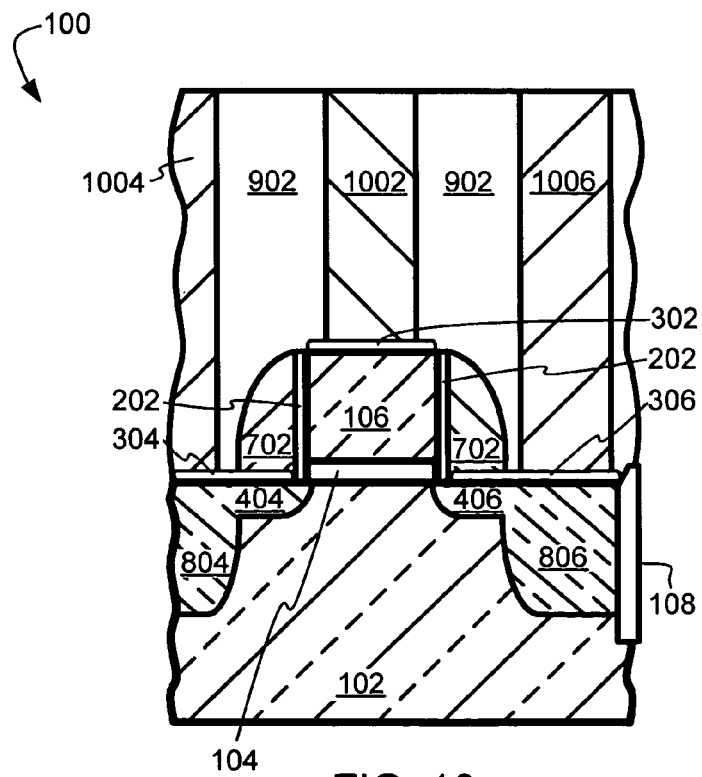
FIG. 10 is the structure of FIG. 9 after formation of metal contacts.

Referring now to FIG. 10, therein is shown the structure of FIG. 9 after formation of metal contacts 1002, 1004, and 1006. The metal contacts 1002, 1004, and 1006 are respectively electrically connected to the salicide layers 302, 304, and 306, and respectively to the gate 106 and the deep S/D junctions 804 and 806.

In various embodiments, the metal contacts 1002, 1004, and 1006 are of metals such as tantalum ("Ta"), titanium ("Ti"), tungsten ("W"), alloys thereof, and compounds thereof. In other embodiments, the metal contacts 1002, 1004, and 1006 are of metals such as copper ("Cu"), gold ("Au"), silver ("Ag"), alloys thereof, compounds thereof, and combinations thereof with one or more of the above elements with diffusion barriers around them.

To complete the integrated circuits, the metal contacts 1002, 1004, and 1006 are connected in conventional manner to additional levels of wiring (not shown) in additional levels of dielectric material (not shown) to the outside of the dielectric material.

Figure 11:
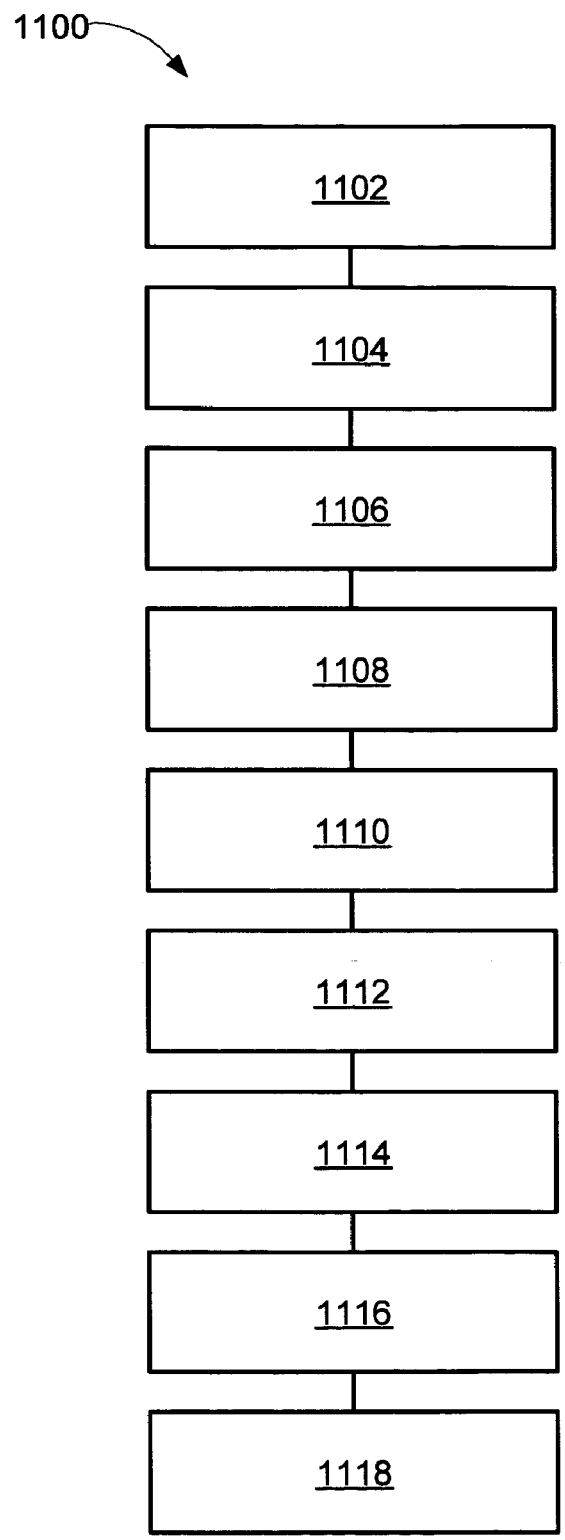
FIG. 11 is a simplified flow chart of the method of manufacturing the silicide in accordance with the present invention.

Referring now to FIG. 11, therein is shown a simplified flow chart of a method 1100 in accordance with the present invention. The method 1100 includes: providing a semiconductor substrate in a block 1102; forming a gate dielectric on the semiconductor substrate in a block 1104; forming a gate on the gate dielectric in a block 1106; forming a metallic layer on the semiconductor substrate in a block 1108; reacting the metallic layer with the semiconductor substrate to form an early phase of silicide in a block 1110; forming implanted shallow source/drain junctions immediately beneath the silicide in a block 1112; forming a final phase of the silicide in a block 1114; depositing an interlayer dielectric above the semiconductor substrate in a block 1116; and forming contacts in the interlayer dielectric to the silicide in a block 1118.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hither-to-fore set forth or shown in the accompanying drawings are to be interpreted in an illustrative and non-limiting sense.

The invention claimed is:

1. A method of forming an integrated circuit comprising:
   providing a semiconductor substrate;
   forming a gate dielectric on the semiconductor substrate;
   forming a gate on the gate dielectric;
   forming a metallic layer on the semiconductor substrate;
   reacting the metallic layer with the semiconductor substrate to form an early phase of silicide;
   forming implanted shallow source/drain junctions immediately beneath the silicide and following the underside contour of the silicide;
   forming a final phase of the silicide;
   depositing an interlayer dielectric above the semiconductor substrate; and
   forming contacts in the interlayer dielectric to the silicide.

2. The method as claimed in claim 1 wherein forming the metallic layer on the semiconductor substrate further comprises forming the metallic layer substantially adjacent the gate.

3. The method as claimed in claim 1 wherein forming implanted shallow source/drain junctions further comprises performing a pre-amorphization implant followed by a high-temperature conversion rapid thermal anneal.

4. The method as claimed in claim 1 wherein depositing the interlayer dielectric deposits a dielectric material having a dielectric constant selected from a group consisting of medium, low, and ultra-low dielectric constants.

5. The method as claimed in claim 1 wherein forming the contacts to the silicide uses materials selected from a group consisting of tantalum, titanium, tungsten, copper, gold, silver, an alloy thereof, a compound thereof, and a combination thereof.

6. A method of forming an integrated circuit comprising:
  providing a semiconductor substrate;
  forming a gate dielectric on the semiconductor substrate;
  forming a gate on the gate dielectric;
  forming a metallic layer on the semiconductor substrate and the gate;
  reacting the metallic layer with the semiconductor substrate and the gate to form an early phase of silicide;
  stripping off unreacted metal from the metallic layer;
  forming implanted shallow source/drain junctions immediately beneath the silicide by ion implantation followed by a high-temperature conversion rapid thermal anneal to activate the implanted ions, to form a final phase of the silicide and to drive the implanted ions into the semiconductor substrate ahead of the silicide;
  forming deep source/drain junctions in the semiconductor substrate;
  depositing an interlayer dielectric above the semiconductor substrate; and
  forming contacts in the interlayer dielectric to the silicide.

7. The method as claimed in claim 6 wherein forming the metallic layer on the semiconductor substrate further comprises forming the metallic layer substantially adjacent the gate.

8. The method as claimed in claim 6 wherein forming implanted shallow source/drain junctions further comprises performing a pre-amorphization implant prior to the high-temperature conversion rapid thermal anneal.

9. The method as claimed in claim 6 wherein depositing the interlayer dielectric deposits a dielectric material having a dielectric constant selected from a group consisting of medium, low, and ultra-low dielectric constants.

10. The method as claimed in claim 6 wherein forming the contacts to the silicide uses materials selected from a group consisting of tantalum, titanium, tungsten, copper, gold, silver, an alloy thereof, a compound thereof, and a combination thereof.

* * * * *